(12) United States Patent
Lee et al.

(10) Patent No.: US 9,029,850 B2
(45) Date of Patent: May 12, 2015

(54) ORGANIC LIGHT-EMITTING DISPLAY APPARATUS

(71) Applicant: Samsung Display Co., Ltd., Yongin, Gyeonggi-do (KR)

(72) Inventors: Yul-Kyu Lee, Yongin (KR); Kyung-Hoon Park, Yongin (KR); Sun Park, Yongin (KR); Yeong-Ho Song, Yongin (KR); Ji-Hoon Song, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/279,396

(22) Filed: May 16, 2014

(65) Prior Publication Data

US 2014/0353634 A1 Dec. 4, 2014

(30) Foreign Application Priority Data

May 31, 2013 (KR) .......................... 10-2013-0063086

(51) Int. Cl.
*H01L 51/00* (2006.01)
*H01L 27/32* (2006.01)

(52) U.S. Cl.
CPC .................................. *H01L 27/3262* (2013.01)

(58) Field of Classification Search
CPC . H01L 51/56; H01L 27/3244; H01L 27/3262; H01L 27/3248; H01L 51/5203; H01L 27/3258; H01L 2227/323; H01L 27/32; H01L 27/3276; H01L 27/3246; H01L 27/326; H01L 51/5228; H01L 29/7869; H01L 51/52
USPC ............. 438/82, 99, 151, 152, 155, 623, 725; 257/40, 49, 59, 204, 208, 350, 353, 257/354, 401, 642–651, 758–770, 790–795, 257/E51.001–51.027, E31.004, E27.117, 257/E29.16, E25.008, E21.024, E21.033, 257/E21.24–E21.269, E33.001; 349/139, 349/146, 147
See application file for complete search history.

(56) References Cited

U.S. PATENT DOCUMENTS

2013/0146878 A1 6/2013 Oh et al.
2013/0175533 A1 7/2013 Lee et al.

FOREIGN PATENT DOCUMENTS

| JP | 2005-268046 A | 9/2005 |
|---|---|---|
| JP | 2005-310591 A | 11/2005 |
| JP | 2012-253124 A | 12/2012 |
| KR | 10-2005-0112034 A | 11/2005 |
| KR | 10-2007-0051636 A | 5/2007 |
| KR | 10-2013-0066290 A | 6/2013 |
| KR | 10-2013-0080642 | 7/2013 |

*Primary Examiner* — Yasser A Abdelaziez
*Assistant Examiner* — Farun Lu
(74) *Attorney, Agent, or Firm* — Lee & Morse, P.C.

(57) ABSTRACT

An organic light-emitting display apparatus includes a thin film transistor including an active layer, a gate electrode, source and drain electrodes, a first insulating layer between the active layer and the gate electrode, and a second insulating layer between the gate electrode and the source and drain electrodes, a third insulating layer covering the source and drain electrodes, the third insulating layer being an organic insulating layer, a pixel electrode including a semi-transparent metal layer and having an end located in a trench formed around the first insulating layer, a fourth insulating layer including an opening exposing a top surface of the pixel electrode, the fourth insulating layer being an organic insulating layer, an organic light-emitting layer on the pixel electrode, and a counter electrode on the organic light-emitting layer.

20 Claims, 9 Drawing Sheets

ORGANIC LIGHT-EMITTING DISPLAY APPARATUS

CROSS-REFERENCE TO RELATED APPLICATION

Korean Patent Application No. 10-2013-0063086, filed on May 31, 2013, in the Korean Intellectual Property Office, and entitled: "Organic Light-Emitting Apparatus," is incorporated by reference herein in its entirety.

BACKGROUND

1. Field

Embodiments relate to an organic light-emitting display apparatus.

2. Description of the Related Art

An organic light-emitting display apparatus may include a hole injection electrode, an electron injection electrode, and an organic light-emitting layer formed therebetween. The organic light-emitting display apparatus is a self light-emitting display apparatus in which light is emitted when holes injected from the hole injection electrode and electrons injected from the electron injection electrode recombine and progressively decay in the organic light-emitting layer. The organic light-emitting display apparatus has received attention as an advanced display device due to its high-quality characteristics, such as low power consumption, high contrast, and fast response speeds.

SUMMARY

Embodiments are directed to an organic light-emitting display apparatus including: a thin film transistor including an active layer, a gate electrode, source and drain electrodes, a first insulating layer between the active layer and the gate electrode, and a second insulating layer between the gate electrode and the source and drain electrodes, a third insulating layer covering the source and drain electrodes, the third insulating layer being an organic insulating layer, a pixel electrode including a semi-transparent metal layer and having an end located in a trench formed around the first insulating layer, a fourth insulating layer having an opening exposing a top surface of the pixel electrode, the fourth insulating layer being an organic insulating layer, an organic light-emitting layer on the pixel electrode, and a counter electrode on the organic light-emitting layer.

The pixel electrode may be located in an opening formed in the third insulating layer.

An etched surface of the third insulating layer may be outside of the trench.

The first insulating layer and the second insulating layer may have a same etched surface.

The first insulating layer may be an inorganic insulating layer.

The organic light-emitting display apparatus may further include a buffer layer under the first insulating layer, wherein the trench may be formed in the buffer layer.

The buffer layer may be an inorganic insulating layer.

The semi-transparent metal layer may include silver (Ag) or an Ag alloy.

A protective layer may be stacked on at least one surface of the semi-transparent metal layer.

The protective layer may include a transparent conductive oxide.

The source and drain electrodes may each be multilayers of different metals having different electron mobilities.

The source and drain electrodes may each include a layer including molybdenum and a layer including aluminum.

The organic light-emitting display apparatus may further include a first pad layer including a same material as the source and drain electrodes and located on the same layer, and a second pad layer located on the first pad layer.

The second pad layer may include a transparent conductive oxide.

The organic light-emitting display apparatus may further include a pixel electrode contact portion electrically connecting the pixel electrode to one of the source and drain electrodes through a contact hole formed in the third insulating layer. The pixel electrode contact portion may include a first contact layer including a same material as the source and drain electrodes, a second contact layer including a same material as the second pad layer, and a third contact layer between the first insulating layer and the second insulating layer, the third contact layer including a same material as a second electrode of a capacitor. The first contact layer may be electrically connected to the third contact layer through a contact hole formed in the second insulating layer.

An end of the third contact layer may protrude from an etched surface of an opening formed in the second insulating layer. The pixel electrode may be directly connected to the end of the third contact layer.

The end of the third contact layer may protrude from an etched surface of an opening formed in the third insulating layer. The pixel electrode may be directly connected to the end of the third contact layer.

The pixel electrode contact portion may further include a fourth contact layer between the third contact layer and the first contact layer and including a same material as the gate electrode.

The organic light-emitting display apparatus may further include a capacitor including a first electrode on a same layer as the active layer and including a semiconductor including ion impurities, and a second electrode including a transparent conductive oxide.

The capacitor may further include a third electrode on a same layer as the source and drain electrodes.

The counter electrode may include a reflective metal layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
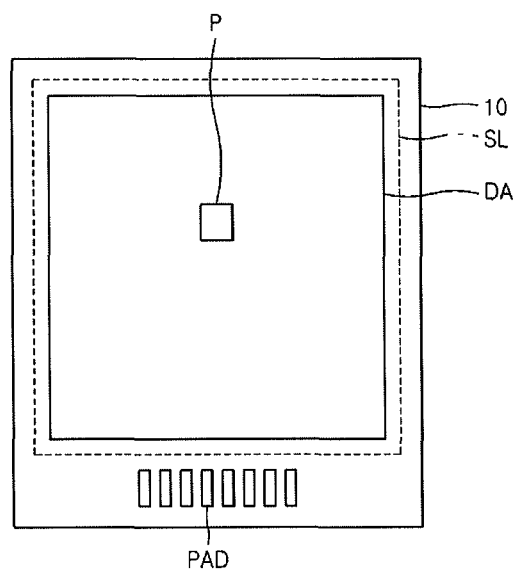
FIG. 1 illustrates a plan view schematically depicting an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It is to be also be understood that when a layer or element is referred to as being "on" another layer or substrate, it can be directly on the other layer or substrate, or intervening layers may also be present. Also, "on" refers to an element being positioned above or below other element, and does not necessarily mean that the element is positioned above the other element based on the direction of gravity. Further, it is to be understood that when a layer is referred to as being "under" another layer, it can be directly under, and one or more intervening layers may also be present. In addition, it is to be understood that when a layer is referred to as being "between" two layers, it can be the only layer between the two layers, or one or more intervening layers may also be present. Like reference numerals refer to like elements throughout.

Also, with regard to various embodiments, the same elements are typically described only in the first embodiment, and the other embodiments may be described by focusing on the differences from the first embodiment.

Furthermore, when it is described that one unit "comprises" some elements, it should be understood that the unit may comprise only those elements, or it may comprise other elements as well as those elements if there is no specific limitation.

As used herein, the term "and/or" includes any and all combinations of one or more of the associated listed items. Expressions such as "at least one of," when preceding a list of elements, modify the entire list of elements and do not modify the individual elements of the list.

Figure 2:
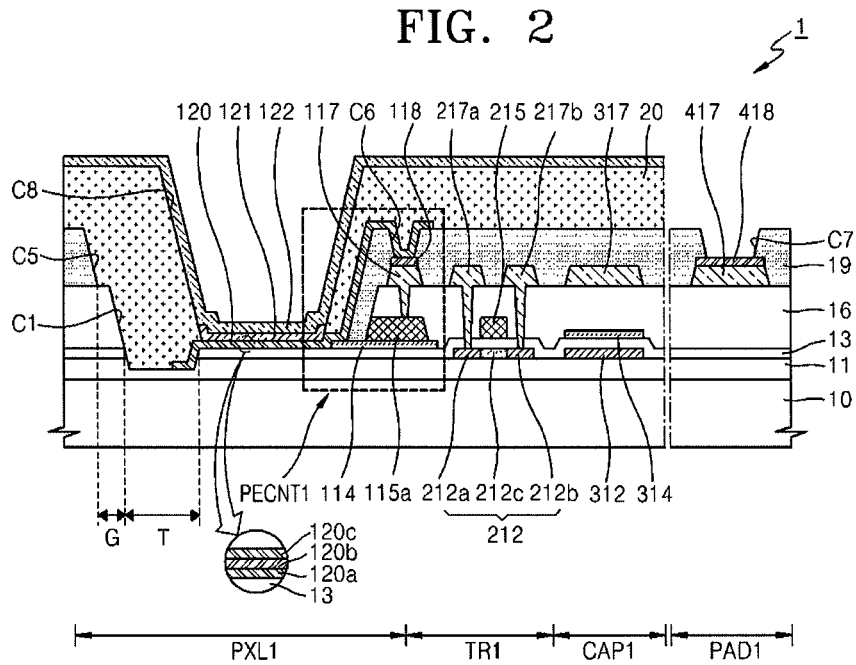
FIG. 2 illustrates a cross-sectional view schematically depicting a region including a pixel contact portion of the organic light-emitting display apparatus of FIG. 1 according to an embodiment.
Figure 3:
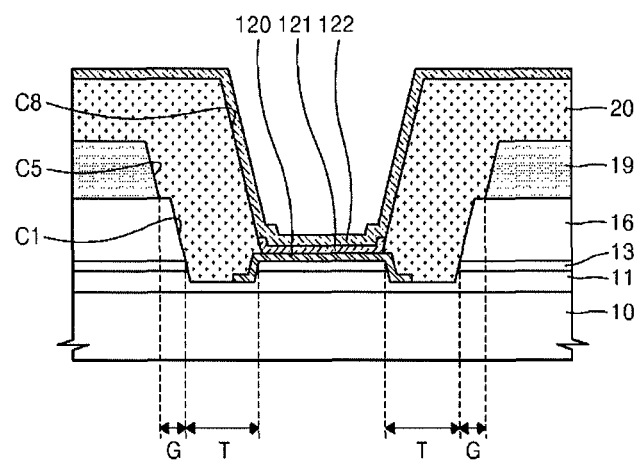
FIG. 3 illustrates a cross-sectional view schematically depicting a region other than the pixel contact portion of the organic light-emitting display apparatus of FIG. 1 according to an embodiment.

FIG. 1 illustrates a plan view schematically depicting an organic light-emitting display apparatus 1 according to an embodiment, FIG. 2 illustrates a cross-sectional view schematically depicting a region including a pixel contact portion PECNT1 of the organic light-emitting display apparatus 1 according to the embodiment, and FIG. 3 illustrates a cross-sectional view schematically depicting a region other than the pixel contact portion PECNT1 of the organic light-emitting display apparatus 1 according to the embodiment.

Referring to FIG. 1, a display area DA displaying an image includes a plurality of pixels P and is formed on a substrate 10 of the organic light-emitting display apparatus 1 according to the embodiment. The display area DA may be formed inside an area delimited by a sealing line SL, and a sealing member (not shown) may seal the display area DA along the sealing line SL.

Referring to FIG. 2, a pixel area PXL1 including at least one organic light-emitting layer 121, a transistor area TR1 including at least one thin film transistor, a capacitor area CAP1 including at least one capacitor, and a pad area PAD1 may be formed on the substrate 10.

In the transistor area TR1, an active layer 212 of the thin film transistor may be formed on the substrate 10 and a buffer layer 11.

The substrate 10 may be a transparent substrate, such as a plastic substrate including polyethylene terephthalate (PET), polyethylene naphthalate (PEN), or polyimide, or a glass substrate, as examples.

The buffer layer 11 for planarizing and blocking penetration of impurity elements in the substrate 10 may be further included. The buffer layer 11 may be formed as a single layer or as a multilayer of silicon nitride and/or silicon oxide.

The active layer 212 may be included in the thin film transistor area TR1 on the buffer layer 11. The active layer 212 may be formed of a semiconductor including amorphous silicon or polysilicon. In other implementations, the active layer may include an oxide semiconductor. The active layer 212 may include a channel region 212c, and a source region 212a and a drain region 212b doped with ion impurities on the outside of the channel region 212c.

A gate electrode 215 may be formed on the active layer 212 at a position corresponding to the channel region 212c of the active layer 212. A first insulating layer 13 as a gate dielectric layer may be disposed between the gate electrode 215 and the active layer 212. The gate electrode 215 may be formed, for example, as a single layer or as a multilayer of one or more metals selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A source electrode 217a and a drain electrode 217b may be respectively connected to the source region 212a and the drain region 212b of the active layer 212. A second insulating layer 16 as an interlayer dielectric may be disposed between the gate electrode 215 and the source electrode 217a and the drain electrode 217b. The source electrode 217a and the drain electrode 217b may be formed of two or more layers of different metals having different electron mobilities. For example, the source electrode 217a and the drain electrode 217b may be formed of two or more layers of metals selected from the group of Al, Pt, Pd, Ag, Mg, Au, Ni, Nd, Ir, Cr, Li, Ca, Mo, Ti, W, Cu, and an alloy thereof.

A third insulating layer 19 may be formed on the second insulating layer 16 to cover the source electrode 217a and the drain electrode 217b.

The first insulating layer 13 and the second insulating layer 16 may be formed as a single layer or as a multilayer including an inorganic insulating layer. The inorganic insulating layer constituting the first insulating layer 13 and the second insulating layer 16 may include $SiO_2$, $SiN_x$, $SiON$, $Al_2O_3$, $TiO_2$, $Ta_2O_5$, $HfO_2$, $ZrO_2$, barium strontium titanate (BST), or lead zirconium titanate (PZT).

The third insulating layer 19 may be formed as an organic insulating layer. The third insulating layer 19 may include a general-purpose polymer (e.g., polymethyl methacrylate (PMMA), polystyrene (PS)), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof.

A fourth insulating layer 20 may be formed on the third insulating layer 19. The fourth insulating layer 20 may be formed as an organic insulating layer. The fourth insulating layer 20 may include a general-purpose polymer (e.g., polymethyl methacrylate (PMMA), polystyrene (PS)), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof.

A pixel electrode 120 may be included in the pixel area PXL1. The pixel electrode 120 may include a semi-transparent metal layer 120b. Also, the pixel electrode 120 may further include layers 120a and 120c including a transparent conductive oxide. The layers 120a and 120c may be respectively formed under and above the semi-transparent metal layer 120b to protect the semi-transparent metal layer 120b.

The semi-transparent metal layer 120b may be formed of Ag or an Ag alloy. The semi-transparent metal layer 120b may improve the light efficiency of the organic light-emitting display apparatus 1 by forming a microcavity structure with a counter electrode 122, which is a reflective electrode to be described below.

The layers 120a and 120c including a transparent conductive oxide may include at least one or more selected from the group of indium tin oxide (ITO), indium zinc oxide (IZO), zinc oxide (ZnO), indium oxide ($In_2O_3$), indium gallium oxide (IGO), and aluminum zinc oxide (AZO). The transparent conductive oxide layer 120a under the semi-transparent metal layer 120b may function as a barrier layer for strengthening the adhesion between the first insulating layer 13 and the pixel electrode 120. The transparent conductive oxide layer 120c above the semi-transparent metal layer 120b may function as a barrier layer for protecting the semi-transparent metal layer 120b.

The semi-transparent metal layer 120b may have a high reactivity as an Ag layer. Particle-like defects may occur if the semi-transparent layer 120b were to react with surrounding materials in a subsequent process when exposed to the outside by diffusion. To avoid such reactions, top and bottom surfaces of the semi-transparent metal layer 120b may be covered with the protective layers 120a and 120c. However, if an end of the semi-transparent metal layer 120b is not covered with the protective layers 120a and 120c, diffusion could cause undesirable effects.

In the organic light-emitting display apparatus 1 according to the present embodiment, the diffusion of Ag may be prevented or substantially reduced by disposing the end of the semi-transparent metal layer 120b inside of a trench T formed in the buffer layer 11 and the first insulating layer 13, which are inorganic insulating layers.

Figure 6:
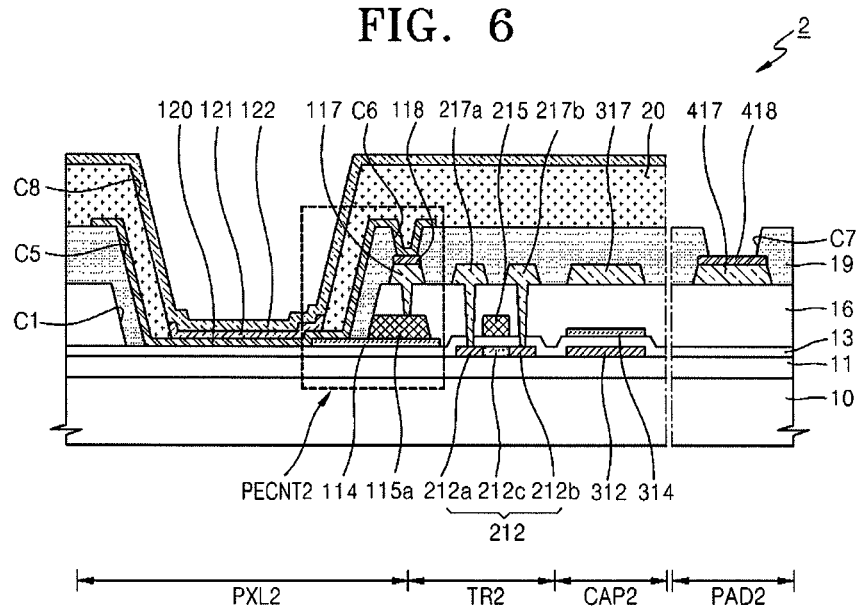
FIG. 6 illustrates a cross-sectional view schematically depicting an organic light-emitting display apparatus according to a comparative example.

FIG. 6 illustrates a cross-sectional view schematically depicting an organic light-emitting display apparatus 2 according to a comparative example. The comparative example is provided in order to better explain certain characteristics of one or more embodiments. It is to be understood that the comparative examples is not to be construed as limiting the scope of the embodiments, nor is the comparative example to be construed as being outside the scope of the embodiments.

Referring to FIG. 6, when the organic light-emitting display apparatus 2 according to the comparative example is compared with the organic light-emitting display apparatus 1 according to the present embodiment, only a structure of a pixel area PXL2 is different, and structures of a transistor area TR2, a capacitor area CAP2, and a pad area PAD2 are the same as those of the organic light-emitting display apparatus 1.

In the organic light-emitting display apparatus 2 according to the comparative example, a pixel electrode 120 is formed along an etched surface of an opening C5 formed in a third insulating layer 19, and in particular, an end of the pixel electrode 120 is formed on a top of the third insulating layer 19. That is, the end of the pixel electrode 120 is disposed between the third insulating layer 19 and a fourth insulating layer 20. As described above, since the third insulating layer 19 and the fourth insulating layer 20 are organic insulating layers which respectively function as a planarization layer and a pixel-defining layer, Ag exposed from the end of the pixel electrode 1120 may diffuse into the entire organic light-emitting display apparatus 2 through the third insulating layer 19 and the fourth insulating layer 20.

However, in the organic light-emitting display apparatus 1 according to the present embodiment, since an end of the pixel electrode 120 is disposed inside of the trench T formed in the buffer layer 11 and the first insulating layer 13, which are formed of inorganic insulating layers, the diffusion of Ag may be prevented or substantially reduced.

Referring to FIGS. 2 and 5H-5J in detail, the pixel electrode 120 is disposed on the buffer layer 11 and the first insulating layer 13, which are disposed on the substrate 10. The pixel electrode 120 is disposed inside of an opening C5 formed in the third insulating layer 19. The end of the pixel electrode 120 is disposed inside of the trench T formed in the buffer layer 11 and the first insulating layer 13.

Figure 4:
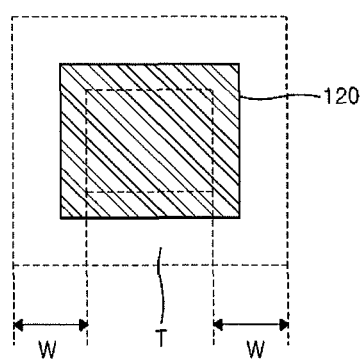
FIG. 4 illustrates a plan view schematically depicting relative positions of a trench and a pixel electrode of the organic light-emitting display apparatus of FIG. 1 according to an embodiment.

Referring to FIG. 4, the trench T may have a predetermined width W1 around the pixel electrode 120 and may form a closed loop. However, the pixel electrode contact portion PECNT1 may be disposed around a light-emitting unit as illustrated in FIG. 2. Accordingly, the trench T may not be formed in a region where forming the trench T is not structurally possible.

When Ag is exposed from the end of the pixel electrode 120 disposed inside of the trench T, Ag may move by diffusion and may meet the buffer layer 11 and the first insulating layer 13 at a bottom surface and a side of the trench T during the movement. The buffer layer 11 and the first insulating layer 13, which are inorganic insulating layers, may become Ag diffusion barriers. Accordingly, the diffusion of Ag may be prevented.

The fourth insulating layer 20 as an organic layer may be formed on the trench T. Accordingly, a top surface of the end of the pixel electrode 120 may be in contact with the fourth insulating layer 20. However, Ag may have a greater tendency to diffuse to lower layers rather than to upper layers. Accordingly, materials of the side and the bottom surface of the trench T may affect the diffusion of Ag more than a material of a top surface of the trench T.

Therefore, as described in the present embodiment, the diffusion of Ag may be prevented or substantially reduced by disposing the end of the pixel electrode 120 inside of the trench T formed in the buffer layer 11 and the first insulating layer 13, which are inorganic insulating layers. Accordingly, the occurrence of particle-like dark spots may be reduced.

When a metal having strong reducing power, such as Ag, receives electrons during an etching process for patterning the pixel electrode 120, Ag ions existing in an ionic state in the etchant may reprecipitate as Ag. Ag thus precipitated may cause particle-like defects that generate dark spots in a subsequent process of forming the pixel electrode 120.

If the source electrode 217a or the drain electrode 217b, a first contact layer 117 of the pixel electrode contact portion PECNT1, a first pad layer 417 of a pad electrode, or data interconnection (not shown) formed of the same material as the above components are exposed to the etchant in the etching process of the pixel electrode 120 including Ag, Ag ions having a strong reducing power may reprecipitate as Ag by receiving electrons from the above metallic materials. For example, in a case where the metals include molybdenum or aluminum, molybdenum may provide electrons transferred from aluminum to Ag ions, and thus, Ag may be reprecipitated. The reprecipitated Ag particles may become particle-like contaminants, and thus, may cause defects, such as dark-spot defects, in a subsequent process.

However, in the organic light-emitting display apparatus 1 according to the present embodiment, the source electrode 217a or the drain electrode 217b may be covered with the third insulating layer 19 as an organic layer. Accordingly, the source electrode 217a or the drain electrode 217b may not be exposed to the etchant including Ag ions during the etching of the pixel electrode 120 including Ag. Therefore, particle-like defects due to the reprecipitation of Ag may be prevented.

The first contact layer 117 and the first pad layer 417 may be respectively disposed in regions exposed by a contact hole C6 and a contact hole C7 that are formed in the third insulating layer 19. A second contact layer 118 and a second pad layer 418 as protective layers may be respectively formed on the first contact layer 117 and the first pad layer 417. Accordingly, the first contact layer 117 and the first pad layer 417 may not be exposed to the etchant during the etching of the pixel electrode 120. Therefore, particle-like defects due to the reprecipitation of Ag may be prevented or substantially reduced.

The pixel electrode 120 may be connected to the pixel electrode contact portion PECNT1 through the contact hole C6 formed in the third insulating layer 19. The pixel electrode contact portion PECNT1 may be electrically connected to one of the source electrode and the drain electrode of the driving transistor to drive the pixel electrode 120.

The pixel electrode contact portion PECNT1 may include the first contact layer 117 including the same material as the source electrode 217a and the drain electrode 217b, the second contact layer 218 including a transparent conductive oxide, a third contact layer 114 including transparent conductive oxide, and a fourth contact layer 115a including the same material as the gate electrode 215.

The third contact layer 114 may be formed to protrude from etched surfaces of an opening C1 formed in the second insulating layer 16 and the opening C5 formed in the third insulating layer 19. The pixel electrode 120 may be directly in contact with the protruding third contact layer 114, and the third contact layer 114 may be in contact with the fourth contact layer 115a. The fourth contact layer 115a and the first contact layer 117 may be connected through a contact hole C2 formed in the second insulating layer 16.

According to the present embodiment, with respect to a method of electrically connecting the pixel electrode 120 and a driving device, in a case where the connection is made only through the contact hole C6 formed in the third insulating layer 19, i.e., through the first contact layer 117 and the second contact layer 118, step coverage may be poor because a thickness of the pixel electrode 120 used as a semi-transparent metal layer may be small. Stable connection to the etched surface or the contact hole C6 of the third insulating layer 19 may be difficult. However, according to the present embodiment, the pixel electrode 120 may be directly connected to the third contact layer 114 at a bottom portion of the opening C5 even if the connection through the contact hole C6 formed in the third insulating layer 19 were to be interrupted. Accordingly, a signal from the driving device may be normally received.

The first contact layer 117 may be connected to a data line (not shown) and the data line may be electrically connected to one of the source electrode and the drain electrode of the driving transistor. If the transistor illustrated in FIG. 2 is a driving transistor, the contact layer 117 may be directly connected to the source electrode 217a or the drain electrode 217b of FIG. 2.

A top surface of the pixel electrode 120 may be exposed by an opening C8 formed in the fourth insulating layer 20, and an intermediate layer including an organic light-emitting layer 121 may be formed on the exposed top surface of the pixel electrode 120. The organic light-emitting layer 121 may be formed of a low molecular weight organic material or a polymer organic material. In a case where the organic light-emitting layer 121 is formed of a low molecular weight organic material, a hole transport layer (HTL), a hole injection layer (HIL), an electron transport layer (ETL), and an electron injection layer (EIL) may be symmetrically stacked about the organic light-emitting layer 121. In addition, various layers may be stacked as desired. Various usable organic materials may include copper phthalocyanine (CuPc), N,N'-di(naphthalene-1-yl)-N,N'-diphenyl-benzidine (NPB), or tris-8-hydroxyquinoline aluminum (Alq3). In a case where the organic light-emitting layer 121 is a polymer organic material, an HTL may be included in addition to the organic light-emitting layer 121. Poly-(3,4)-ethylene-dihydroxy thiophene (PEDOT) or polyaniline (PANI) may be used as the HTL. In this case, a usable organic material may include a polymer organic material, such as a poly(phenylenevinylene) (PPV) or a polyfluorene. Also, an inorganic material may be further included between the organic light-emitting layer 121 and the pixel electrode 120 or the counter electrode 122.

It is illustrated in FIG. 2 that the organic light-emitting layer 121 is disposed at a bottom of the opening C8. In other implementations, the organic light-emitting layer 121 may not only be formed at the bottom of the opening C8, but may also be formed to extend to a top surface of the fourth insulating layer 20 along the etched surface of the opening C5 formed in the third insulating layer 19.

A counter electrode 122 may be formed as a common electrode on the organic light-emitting layer 121. With respect to the organic light-emitting display apparatus 1 according to the present embodiment, the pixel electrode 120 is used as an anode and the counter electrode 122 is used as a cathode. However, the polarities of the electrodes may be reversed.

The counter electrode 122 may be formed of a reflective electrode including a reflective material. In this case, the counter electrode 122 may include one or more materials selected from the group of Al, Mg, Li, Ca, LiF/Ca, and LiF/Al. The counter electrode 122 may be formed of the reflective electrode. Accordingly, light emitted from the organic light-emitting layer 121 may be reflected from the counter electrode 122 to transmit through the semi-transparent metal pixel electrode 120, and thus, the light may be emitted toward the substrate 10.

The organic light-emitting display apparatus 1 may be a bottom-emission type display apparatus in which an image is realized on the substrate 10 by emission of light from the organic light-emitting layer 121 toward the substrate 10. Therefore, the counter electrode 122 may be formed of a reflective electrode.

In the capacitor area CAP1, a capacitor including a first electrode 312 disposed at the same layer as the active layer 212, a second electrode 314 disposed at the same layer as the gate electrode 215, and a third electrode 317 disposed at the same layer as the source electrode 217a and the drain electrode 217b may be disposed on the substrate 10 and the buffer layer 11.

The first electrode 312 of the capacitor may be formed of a semiconductor doped with ion impurities as in the case of the source region 212a and the drain region 212b of the active layer 212.

Although the second electrode 314 of the capacitor may be disposed on the first insulating layer 13 similar to the gate electrode 215, a material thereof may be different from the gate electrode 215. The material of the second electrode 314 may include a transparent conductive oxide. The capacitor may be formed in a metal-insulator-metal (MIM) structure by forming a semiconductor doped with ion impurities in the first electrode 312 through the second electrode 314.

The third electrode 317 of the capacitor may be formed of the same material as the source electrode 217a and the drain electrode 217b. As described above, the third electrode 317 may be in a state of being covered with the third insulating layer 19 as an organic layer. Accordingly, the third electrode 317 may not exposed to the etchant including Ag ions during the etching of the pixel electrode 120 including Ag. Therefore, particle-like defects due to the reprecipitation of Ag may be prevented or substantially reduced. Also, the capacitor may be connected in parallel with the first electrode and the second electrode. Accordingly, capacitance of the organic light-emitting display apparatus may be increased without increasing an area of the capacitor. The area of the capacitor may be decreased as much as the increased amount of the capacitance. Accordingly, an aperture ratio may be increased.

The pad area PAD1, on which the pad electrode 417 and 418 as a connection terminal of an external driver is disposed, may be disposed outside of the display area DA.

The first pad layer 417 may include a plurality of layers of metals having different electron mobilities similar to the above-described source electrode 217a and the drain electrode 217b. For example, the first pad layer 417 may be formed as a multilayer of one or more metals selected from the group of Al, Pt, Pd, Ag, Mg, Au, Ni, Nd, Ir, Cr, Li, Ca, Mo, Ti, W, and Cu.

The second pad layer 418 may be formed of transparent conductive oxide including at least one or more selected from the group of ITO, IZO, ZnO, $In_2O_3$, IGO, and AZO. A reduction of the reliability of the pad electrode may be prevented or substantially reduced by avoiding exposure of the first pad layer 417 to moisture and oxygen.

As described above, the first pad layer 417 may be disposed in a region exposed to the contact hole C7 that is formed in the third insulating layer 19. The second pad layer 418 as a protective layer may be formed on the first pad layer 417. Accordingly, first pad layer 417 may not be exposed to the etchant during the etching of the pixel electrode 120.

Furthermore, an end of the first pad layer 417, which is sensitive to the external factors such as moisture or oxygen, may be covered with the third insulating layer 19. Accordingly, the end of the first pad layer 417 may also not be exposed to the etchant during the etching of the pixel electrode 120.

Therefore, particle-like defects due to the reprecipitation of Ag may be prevented or substantially reduced, and the reduction of the reliability of the pad electrode may be prevented or substantially reduced also.

The organic light-emitting display apparatus 1 according to the present embodiment may further include a sealing member (not shown) for sealing the display area including the pixel area PXL1, the capacitor area CAP1, and the thin film transistor area TR1. The sealing member may be formed of a substrate including a glass material, a metal film, or a sealing thin film on which an organic insulating layer and an inorganic insulating layer are alternatingly disposed.

Hereinafter, stages of a method of manufacturing the organic light-emitting display apparatus 1 according to the present embodiment will be described with reference to FIGS. 5A to 5J.

Figure 5A:
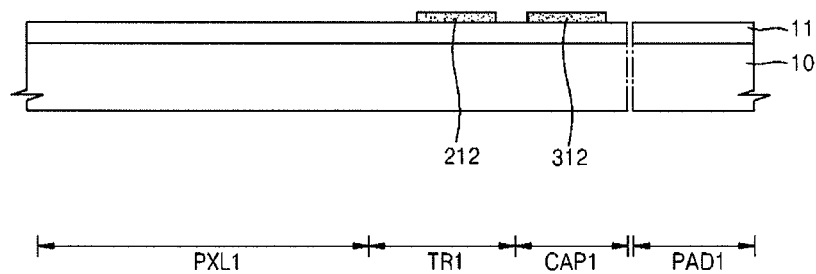
FIGS. 5A through 5J illustrate cross-sectional views schematically depicting stages of a method of manufacturing the organic light-emitting display apparatus of FIG. 1 according to an embodiment.

FIG. 5A illustrates a cross-sectional view schematically depicting a first mask process for manufacturing the organic light-emitting display apparatus 1 according to the present embodiment.

Referring to FIG. 5A, a buffer layer 11 may be formed on a substrate 10 and a semiconductor layer (not shown) is formed on the buffer layer 11. Then, an active layer 212 of a thin film transistor and a first electrode 312 of a capacitor may be formed by patterning the semiconductor layer (not shown).

The semiconductor layer (not shown) may be coated with a photoresist (not shown), and the semiconductor layer (not shown) may then be patterned by photolithography using a first photomask (not shown) to form the above-described active layer 212 and first electrode 312. The first mask process by photolithography may be performed through a series of processes, such as developing, etching, and stripping or ashing, after the first photomask (not shown) is exposed with an exposure apparatus (not shown).

The semiconductor layer (not shown) may be formed of amorphous silicon or polysilicon. In some implementations, the semiconductor layer may include an oxide conductor. When the semiconductor layer is polysilicon, the polysilicon may be formed by crystallization of the amorphous silicon. Various methods, such as rapid thermal annealing (RTA), solid phase crystallization (SPC), excimer laser annealing (ELA), metal induced crystallization (MIC), metal induced lateral crystallization (MILC), or sequential lateral solidification (SLS), may be used as a crystallization method of the amorphous silicon.

Figure 5B:
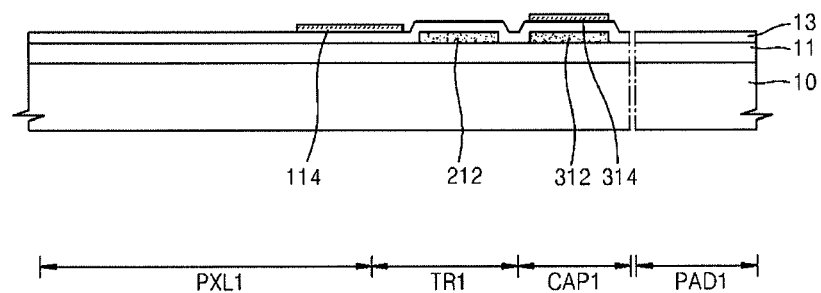

FIG. 5B illustrates a cross-sectional view schematically depicting a second mask process for manufacturing the organic light-emitting display apparatus 1 according to the present embodiment.

A first insulating layer 13 may be formed on the product of the first mask process of FIG. 5A, a transparent conductive oxide layer (not shown) may be formed on the first insulating layer 13, and the transparent conductive oxide layer (not shown) may then be patterned.

As a result of the patterning, a third contact layer 114 of a pixel electrode contact portion and a second electrode 314 of a capacitor may be formed on the first insulating layer 13.

Figure 5C:
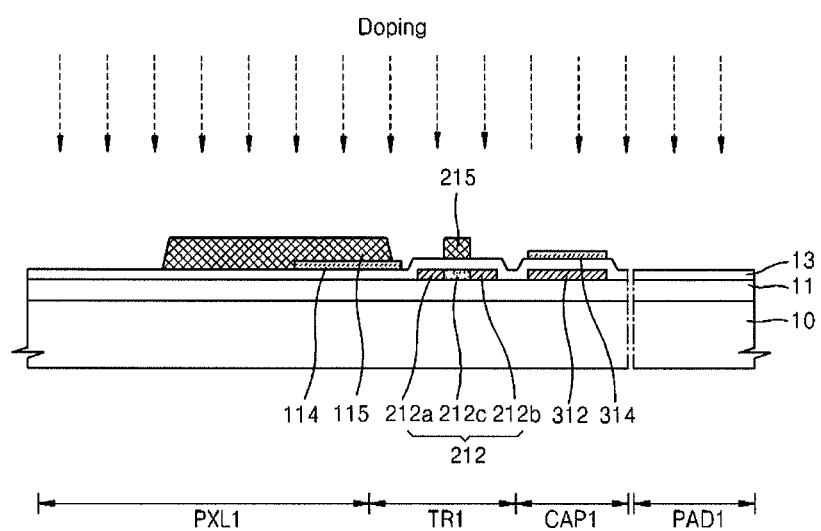

FIG. 5C illustrates a cross-sectional view schematically depicting a third mask process for manufacturing the organic light-emitting display apparatus 1 according to the present embodiment.

A first metal layer (not shown) may be stacked on the product of the second mask process of FIG. 5B, and the first metal layer (not shown) may then be patterned. The first metal layer (not shown) may be formed as a single layer or multilayer of one or more metals selected from the group of Al, Pt, Pd, Ag, Mg, Au, Ni, Nd, Ir, Cr, Li, Ca, Mo, Ti, W, and Cu.

As a result of the patterning, a gate electrode 215 and a gate metal layer 115 covering the third contact layer 114 may be formed on the first insulating layer 13.

The resultant structure as described above may be doped with ion impurities. Boron (B) or phosphorous (P) ions may be used as the ion impurities. The active layer 212 of the thin film transistor and the first electrode 312 of the capacitor may be doped at a concentration of about $1\times10^{15}$ atoms/cm$^3$ or more.

The active layer 212 may be doped with ion impurities by using the gate electrode 215 as a self-align mask. The active layer 212 may include a source region 212a and a drain region 212b, which are doped with ion impurities, and a channel region 212c disposed therebetween. The first electrode 312 may also be doped with ion impurities to become an electrode constituting an MIM CAP.

Therefore, the first electrode 312 of the capacitor as well as the active layer 212 may be simultaneously doped by using a single doping process. Thus, the manufacturing costs may be reduced due to the reduction of doping processes.

Figure 5D:
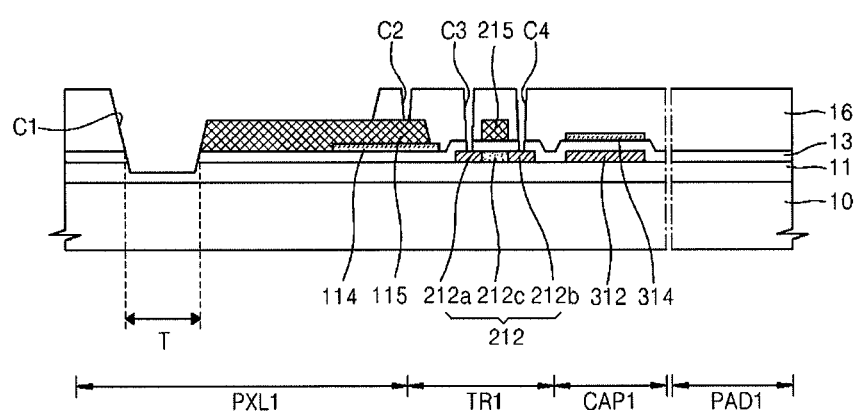

FIG. 5D illustrates a cross-sectional view schematically depicting a result of a fourth mask process for manufacturing the organic light-emitting display apparatus 1 according to the present embodiment.

Referring to FIG. 5D, a second insulating layer 16 may be formed on the product of the third mask process of FIG. 5C. The second insulating layer 16 may be patterned to form openings C3 and C4 exposing the source region 212*a* and the drain region 212*b* and an opening C1 in a region spaced apart from a side of the active layer 212, i.e., a region on which a pixel electrode 120 to be described below will be disposed. The buffer layer 11 and the first insulating layer 13 around the gate metal layer 115 may be etched to form a trench T having a predetermined width W.

Figure 5E:
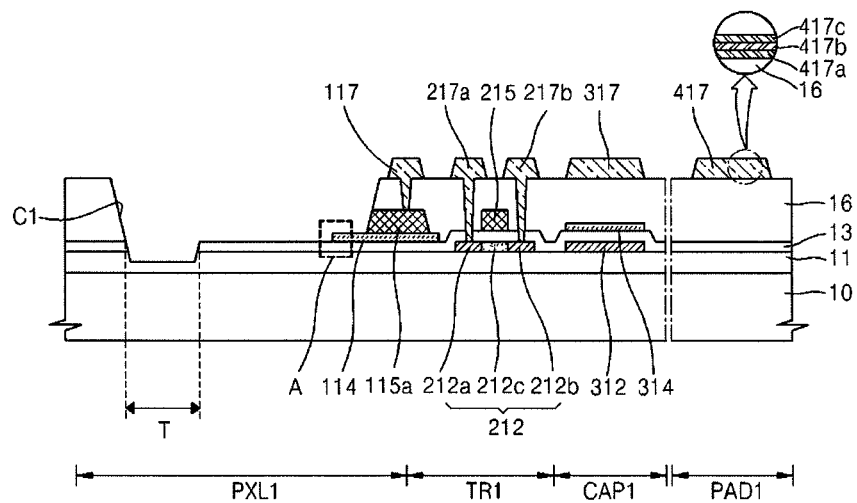

FIG. 5E illustrates a cross-sectional view schematically depicting a result of a fifth mask process for manufacturing the organic light-emitting display apparatus 1 according to the present embodiment.

Referring to FIG. 5E, a second metal layer (not shown) may be formed on the product of the fourth mask process of FIG. 5D. The second metal layer (not shown) may be patterned to simultaneously form a source electrode 217*a* and a drain electrode 217*b*, a first contact layer 117 of the pixel electrode contact portion, and a first pad layer 417 of a pad electrode.

In this case, the gate metal layer 115 as well as the second metal layer (not shown) may also be etched, and an end A of the third contact layer 114 of the pixel electrode contact portion may protrude from an end of an etched surface of the second insulating layer 16.

The second metal layer (not shown) may be formed of two or more layers of different metals having different electron mobilities. For example, the second metal layer (not shown) may be formed of two or more layers of metals selected from the group of Al, Pt, Pd, Ag, Mg, Au, Ni, Nd, Ir, Cr, Li, Ca, Mo, Ti, W, Cu, and an alloy thereof.

A configuration of the first pad layer 417 is illustrated in detail in order to exemplarily describe a configuration of the second metal layer (not shown). For example, the second metal layer (not shown) of the present embodiment may be formed of a first layer 417*a* including Mo, a second layer 417*b* including Al, and a third layer 417*c* including Mo.

The second layer 417*b* including Al may be a metal layer having low resistance and excellent electrical properties. The first layer 417*a* including Mo disposed under the second layer 417*b* may strengthen the adhesion between the second insulating layer 16 and the second layer 417*b*. The third layer 417*c* including Mo disposed on the second layer 417*b* may function as a barrier layer for preventing roughness, oxidation, and diffusion of Al included in the second layer 417*b*.

Although not illustrated in FIG. 5E, in the fifth mask process, the second metal layer (not shown) may be patterned to simultaneously form a data interconnection.

Figure 5F:
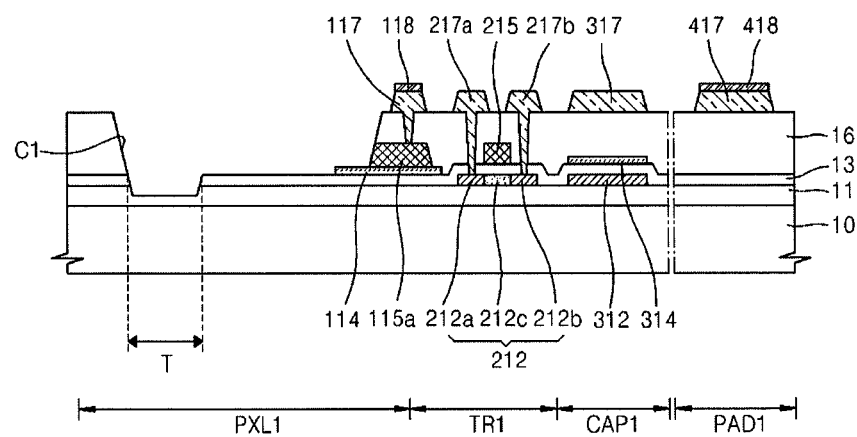

FIG. 5F illustrates a cross-sectional view schematically depicting a result of a sixth mask process for manufacturing the organic light-emitting display apparatus 1 according to the present embodiment.

Referring to FIG. 5F, a transparent conductive oxide layer (not shown) may be formed on the product of the fifth mask process of FIG. 5E. The transparent conductive oxide layer (not shown) may be patterned to simultaneously form a second contact layer 118 of the pixel electrode contact portion and a second pad layer 418 of the pad electrode.

At least one or more selected from the group of ITO, IZO, ZnO, $In_2O_3$, IGO, and AZO may be used as the transparent conductive oxide layer (not shown).

Figure 5G:
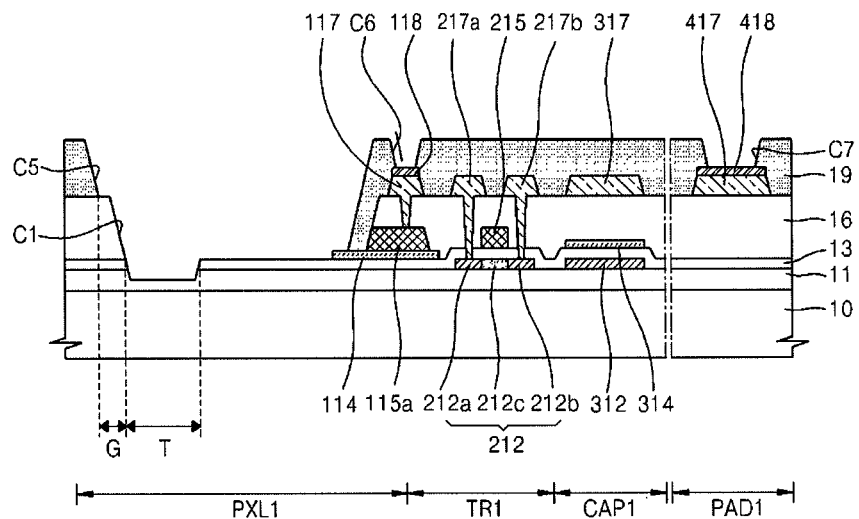

FIG. 5G illustrates a cross-sectional view schematically depicting a result of a seventh mask process for manufacturing the organic light-emitting display apparatus 1 according to the present embodiment.

Referring to FIG. 5G, a third insulating layer 19 may be formed on the product of the sixth mask process of FIG. 5F. The third insulating layer 19 may be patterned to form a contact hole C6 exposing a top of the second contact layer 118 of the pixel electrode contact portion, a contact hole C7 exposing a top of the second pad layer 418, and an opening C5 in a pixel area PXL1 on which the pixel electrode 120 to be described below will be disposed.

The third insulating layer 19 may be formed so as to completely cover the source electrode 217*a* and the drain electrode 217*b*, and thus, may block two types of interconnections having different potentials from being in contact with an etchant having Ag ions dissolved therein during the etching of the pixel electrode 120 including Ag to be described below.

The third insulating layer 19 may be formed of an organic insulating layer and may function as a planarization layer. A general-purpose polymer (e.g., polymethyl methacrylate (PMMA), polystyrene (PS)), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof may be used as the organic insulating layer.

An end of the opening C5 of the third insulating layer 13 may be formed to be spaced apart by a predetermined gap G from the outside of the trench T. Otherwise, the function of the trench T as an Ag diffusion barrier could be weakened if the third insulating layer 19 were disposed in the trench T.

Figure 5H:
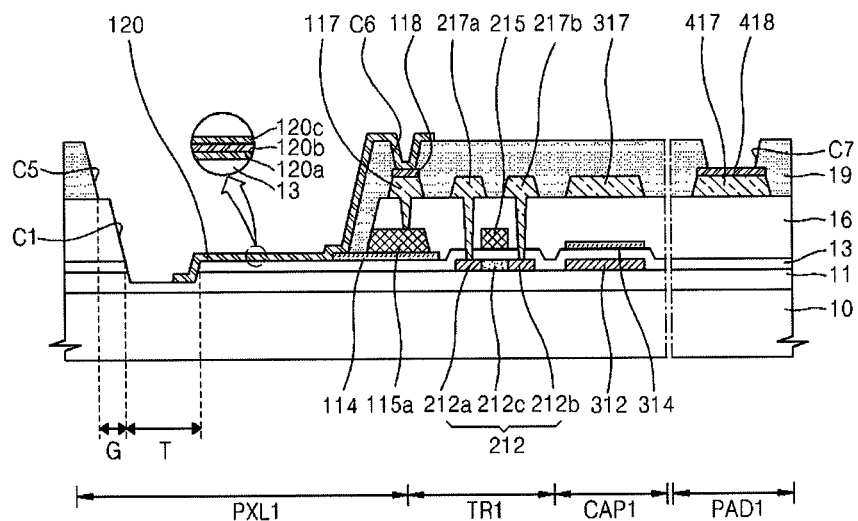

FIG. 5H illustrates a cross-sectional view schematically depicting a result of an eighth mask process for manufacturing the organic light-emitting display apparatus 1 according to the present embodiment.

Referring to FIG. 5H, a semi-transparent metal layer (not shown) may be formed on the product of the seventh mask process of FIG. 5G. The semi-transparent metal layer (not shown) may be patterned to form a pixel electrode 120.

The pixel electrode 120 may be connected to a driving transistor through a pixel electrode contact portion PECNT1 and disposed in the opening C5 formed in the third insulating layer 19. In particular, an end of the pixel electrode 120 may be disposed in the trench T formed in the buffer layer 11 and the first insulating layer 13. The buffer layer 11 and the first insulating layer 13, which are inorganic layers, may become Ag diffusion barriers to prevent or substantially reduce the diffusion of Ag. The pixel electrode 120 may be formed of a semi-transparent metal layer 120*b*. The pixel electrode 120 may further include layers 120*a* and 120*c* that are respectively formed above and under the semi-transparent metal layer 120*b* to protect the semi-transparent metal layer 120*b*. The layers 120*a* and 120*b* may include transparent conductive oxide.

The semi-transparent metal layer 120*b* may be formed of Ag or an Ag alloy. The layers 120*a* and 120*c* including a transparent conductive oxide may include at least one or more selected from the group of ITO, IZO, ZnO, $In_2O_3$, IGO, and AZO. The semi-transparent metal layer 120*b* may improve the light efficiency of the organic light-emitting display apparatus 1 by forming a microcavity structure with a counter electrode 122, which is a reflective electrode to be described below.

When a metal having a strong reducing power, such as Ag, receives electrons during an etching process for patterning the pixel electrode 120, Ag ions existing in an ionic state in the etchant may reprecipitate as Ag. If the source electrode 217a or the drain electrode 217b, the first contact portion 117 of the pixel electrode contact portion, the first pad layer 417, or data interconnection (not shown) formed of the same material as the above components are exposed to the etchant in the etching process of the pixel electrode 120 including Ag, Ag ions having strong reducing power may reprecipitate as Ag by receiving electrons from the above metallic materials.

However, in the present embodiment, the source electrode 217a or the drain electrode 217b may already be patterned and covered with the third insulating layer 19 as an organic layer before the eighth mask process for patterning the pixel electrode 120. Accordingly, the source electrode 217a or the drain electrode 217b may not be exposed to the etchant including Ag ions during the etching of the pixel electrode 120 including Ag. Therefore, particle-like defects due to the reprecipitation of Ag may be prevented or substantially reduced.

Also, in the present embodiment, the first contact layer 117 of the pixel electrode contact portion and the first pad layer 417 may be respectively disposed in regions exposed by the contact hole C6 and the contact hole C7 that are formed in the third insulating layer 19. The second contact layer 118 of the pixel electrode contact portion and the second pad layer 418 as protective layers may be respectively formed on the first contact layer 117 of the pixel electrode contact portion and the first pad layer 417. Accordingly, the first contact layer 117 of the pixel electrode contact portion and the first pad layer 417 may not be exposed to the etchant during the etching of the pixel electrode 120. Therefore, particle-like defects due to the reprecipitation of Ag may be prevented or substantially reduced.

Figure 5I:
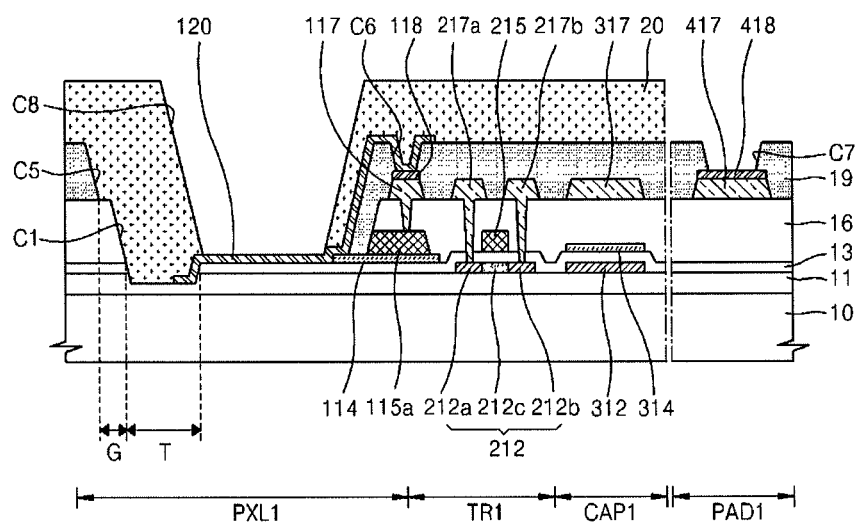
Figure 5J:
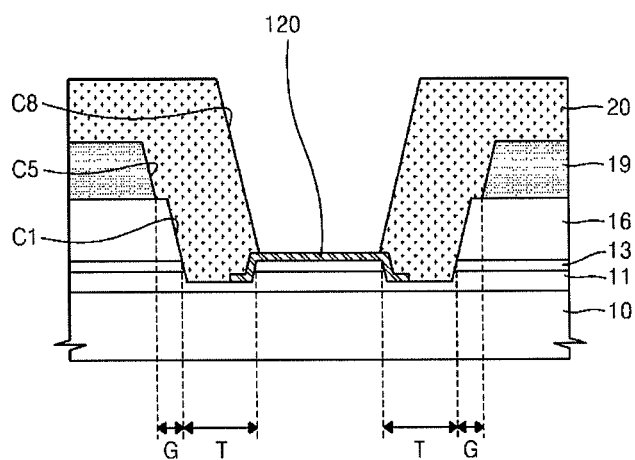

FIGS. 5I and 5J illustrate cross-sectional views schematically depicting a result of a ninth mask process for manufacturing the organic light-emitting display apparatus 1 according to the present embodiment. FIG. 5I illustrates a cross-sectional view schematically depicting an area including a pixel contact portion, and FIG. 5J illustrates a cross-sectional view schematically illustrating an area other than the pixel contact portion.

Referring to FIGS. 5I and 5J, a fourth insulating layer 20 may be formed on the product of the eighth mask process of FIG. 5H. The ninth mask process may then be performed to form an opening C8 that exposes a top of the pixel electrode 120.

The fourth insulating layer 20 may function as a pixel-defining layer. The fourth insulating layer 2, may be formed of an organic insulating layer including, for example, a general-purpose polymer (e.g., polymethyl methacrylate (PMMA), polystyrene (PS)), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof.

An intermediate layer (not shown) including an organic light-emitting layer 121 (see FIG. 2) may be formed on the product of the eighth mask process of FIG. 5H, and a counter electrode 122 (see FIG. 2) may be formed.

By way of summation and review, embodiments provide an organic light-emitting display apparatus having excellent display quality The following effects may be obtained according to the organic light-emitting display apparatus according to embodiments and the method of manufacturing the same.

A pixel electrode may be formed of a semi-transparent metal layer. Accordingly light efficiency of the display apparatus may be improved by a microcavity structure.

Dark-spot defects may be reduced by preventing or hindering the diffusion of Ag by locating an end of the pixel electrode in a trench of an inorganic insulating layer.

A source electrode and a drain electrode (including data interconnection) may be covered with a third insulating layer as an organic layer. Accordingly, reprecipitation of Ag due to the source electrode and the drain electrode during patterning of the pixel electrode may be prevented or substantially reduced.

Protective layers may be respectively formed on a first contact layer of a pixel electrode contact portion, a first contact layer of a cathode contact portion, and a first pad layer of a pad electrode. Accordingly, the reprecipitation of Ag due to the first contact layer and the first pad layer during the patterning of the pixel electrode may be prevented.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. An organic light-emitting display apparatus, comprising:
   a thin film transistor including an active layer, a gate electrode, source and drain electrodes, a first insulating layer between the active layer and the gate electrode, and a second insulating layer between the gate electrode and the source and drain electrodes;
   a third insulating layer covering the source and drain electrodes, the third insulating layer being an organic insulating layer;
   a pixel electrode including a semi-transparent metal layer and having an end located in a trench formed around the first insulating layer;
   a fourth insulating layer including an opening exposing a top surface of the pixel electrode, the fourth insulating layer being an organic insulating layer;
   an organic light-emitting layer on the pixel electrode; and
   a counter electrode on the organic light-emitting layer.

2. The organic light-emitting display apparatus as claimed in claim 1, wherein the pixel electrode is located in an opening formed in the third insulating layer.

3. The organic light-emitting display apparatus as claimed in claim 1, wherein an etched surface of the third insulating layer is outside of the trench.

4. The organic light-emitting display apparatus as claimed in claim 3, wherein the first insulating layer and the second insulating layer have a same etched surface.

5. The organic light-emitting display apparatus as claimed in claim 1, wherein the first insulating layer is an inorganic insulating layer.

6. The organic light-emitting display apparatus as claimed in claim 1, further comprising a buffer layer under the first insulating layer,
   wherein the trench is formed in the buffer layer.

7. The organic light-emitting display apparatus as claimed in claim 1, wherein the buffer layer is an inorganic insulating layer.

8. The organic light-emitting display apparatus as claimed in claim 1, wherein the semi-transparent metal layer includes silver (Ag) or an Ag alloy.

9. The organic light-emitting display apparatus as claimed in claim 8, wherein a protective layer is stacked on at least one surface of the semi-transparent metal layer.

10. The organic light-emitting display apparatus as claimed in claim 9, wherein the protective layer includes a transparent conductive oxide.

11. The organic light-emitting display apparatus as claimed in claim 1, wherein the source and drain electrodes are each multilayers of different metals having different electron mobilities.

12. The organic light-emitting display apparatus as claimed in claim 11, wherein the source and drain electrodes each include a layer including molybdenum and a layer including aluminum.

13. The organic light-emitting display apparatus as claimed in claim 1, further comprising a first pad layer including a same material as the source and drain electrodes and located on the same layer, and a second pad layer located on the first pad layer.

14. The organic light-emitting display apparatus as claimed in claim 13, wherein the second pad layer includes a transparent conductive oxide.

15. The organic light-emitting display apparatus as claimed in claim 13, further comprising a pixel electrode contact portion electrically connecting the pixel electrode to one of the source and drain electrodes through a contact hole formed in the third insulating layer, wherein:
the pixel electrode contact portion includes a first contact layer including a same material as the source and drain electrodes, a second contact layer including a same material as the second pad layer, and a third contact layer between the first insulating layer and the second insulating layer, the third contact layer including a same material as a second electrode of a capacitor, and the first contact layer is electrically connected to the third contact layer through a contact hole formed in the second insulating layer.

16. The organic light-emitting display apparatus as claimed in claim 15, wherein:
an end of the third contact layer protrudes from an etched surface of an opening in the second insulating layer, and
the pixel electrode is directly connected to the end of the third contact layer.

17. The organic light-emitting display apparatus as claimed in claim 16, wherein:
the end of the third contact layer protrudes from an etched surface of an opening in the third insulating layer, and
the pixel electrode is directly connected to the end of the third contact layer.

18. The organic light-emitting display apparatus as claimed in claim 15, wherein:
the pixel electrode contact portion further includes a fourth contact layer between the third contact layer and the first contact layer and including a same material as the gate electrode.

19. The organic light-emitting display apparatus as claimed in claim 1, further comprising a capacitor including a first electrode on a same layer as the active layer and including a semiconductor including ion impurities, and a second electrode including a transparent conductive oxide.

20. The organic light-emitting display apparatus as claimed in claim 1, wherein the counter electrode includes a reflective metal layer.

* * * * *